United States Patent
Osinski et al.

(10) Patent No.: US 9,054,492 B2
(45) Date of Patent: Jun. 9, 2015

(54) LIGHT-EMITTING DEVICE HAVING PHOTON-LIFETIME MODULATION

(71) Applicants: Marek A. Osinski, Albuquerque, NM (US); Gennady A. Smolyakov, Albuquerque, NM (US)

(72) Inventors: Marek A. Osinski, Albuquerque, NM (US); Gennady A. Smolyakov, Albuquerque, NM (US)

(73) Assignee: STC.UNM, Albuquerque, NM (US)

( * ) Notice: Subject to any disclaimer, the term of this patent is extended or adjusted under 35 U.S.C. 154(b) by 0 days.

(21) Appl. No.: 13/998,782

(22) Filed: Dec. 5, 2013

(65) Prior Publication Data
US 2014/0161148 A1 Jun. 12, 2014

Related U.S. Application Data

(60) Provisional application No. 61/797,476, filed on Dec. 7, 2012.

(51) Int. Cl.
| | |
|---|---|
| H01S 5/00 | (2006.01) |
| H01S 5/10 | (2006.01) |
| H01S 5/40 | (2006.01) |
| H01S 5/026 | (2006.01) |
| H01S 5/062 | (2006.01) |
| H01S 5/125 | (2006.01) |
| H01S 5/22 | (2006.01) |
| H01S 5/343 | (2006.01) |

(52) U.S. Cl.
CPC ............ *H01S 5/1071* (2013.01); *H01S 5/4006* (2013.01); *H01S 5/026* (2013.01); *H01S 5/06213* (2013.01); *H01S 5/1032* (2013.01); *H01S 5/125* (2013.01); *H01S 5/22* (2013.01); *H01S 5/34306* (2013.01)

(58) Field of Classification Search
USPC .................. 372/43.01, 44.01, 50.1, 64, 69
See application file for complete search history.

(56) References Cited

U.S. PATENT DOCUMENTS

8,009,712 B2 * 8/2011 Osinski et al. ............. 372/44.01

OTHER PUBLICATIONS

A.E. Avrutin et al, Control of surface-emitting laser diodes by modulating the distributed Bragg mirror reflectivity: Small-signal analysis, Appl. Phys. Lett., 63, 18, Nov. 1, 1993.
William C. Chang, RF Photonic Technology in Optical Fiber Links, Cambridge University Press, 2002.
Chih-Hao Chang et al, Injection Locking of VCSELs IEEE Journal Of Selected Topics In Quantum Electronics, vol. 9, No. 5, pp. 1386-1393, Sep./Oct. 2003.
H.F. Chen et al, Response characteristics of diect current modualtion on a bandwidth-enhanced semiconductor laser under strong injection locking, Optics Communications, 173, 349-355 2000.
Lukas Chrostowski et al, Enhancement of Dynamic Range in 1.55-um VCSELs Using Injection Locking, IEEE Photonics Technology Letters vol. 15, No. 4, pp. 498-500, Apr. 2003.
Lukas Chrostowski et al, 50 GHz Optically Injeciton-Locked 1.55-um VCSELs, IEEE Photonics Technology Letters, vol. 18, No. 2, pp. 367-369, Jan. 15, 2006.
Lukas Chrostowski et al, Microwave Performance of Optically Injection-Locked VCSELs, IEEE Transactions On Microwave Theory And Techniques, vol. 54, No. 2, pp. 788-796 2006.

(Continued)

*Primary Examiner* — Dung Nguyen

(57) ABSTRACT

The invention provides a semiconductor light-emitting device having a monolithically integrated master laser, such as a distributed-Bragg-reflector (DBR) master laser, and injection-locked ring slave laser with modulated photon lifetime for optical communication beyond 100 GHz.

23 Claims, 6 Drawing Sheets

(56) References Cited

OTHER PUBLICATIONS

Haeyang Chung et al, Modeling and Optimizaton of Traveling-Wave LiNbO3 Interferometric Modulators, IEEE Journal of Quantum Electronics, vol. 27, No. 1, pp. 608-617, 1991.

Charles H. Cox III et al, Limits on the Performance of RF- Over-Fiber Links and Their Impact on Device Design, IEEE Transactions On Microwave Theory And Techniques, vol. 54, No. 2, pp. 906-920, 2006.

Daoxin Dai et al, Hybrid silicon lasers for optical interconnects, New Journal of Physics, 11 2009.

Steven R.A. Dods et al, Q-Modulation of a Surface Emitting Laser and an Integral Detuned Cavity, IEEE Journal of Quantum Electronics, vol. 30, No. 5, pp. 1204-1211, 1994.

Ganesh K. Gopalakrishnan et al, Performance and Modeling of Resonantly Enhanced LiNbO3 Modulators for Low-Loss Analog Fiber-Optic Links, IEE Transactions On Microwave Theory And Techniques, vol. 42, No. 12, pp. 2650-2656, 1994.

Jina-Jun He, Proposal for Q-Modulated Semiconductor Laser, IEEE Photonics Technology Letters, vol. 19, No. 5, pp. 285-287, 2007.

Xiaomin Jin et al, Bandwidth enhancement of Fabry-Perot quantum-well lasers by injection-locking.

S.K. Hwang et al, 35-GHz Intrinsic Bandwidth for Direct Modulation in 1.3-um Semiconductor Lasers Subject to Strong Injection Locking, IEEE Photonics technology Letters, vol. 16, No. 4, pp. 972-974, 2004.

Robin J. Jones et al, Influence of detuned injectoin locking on the relaxation oscillation frequency of a multimode semiconductor laser, Journal Of Modern Optics, vol. 47, No. 11, pp. 1977-1986 2000.

F. Kappe et al, 35 GHz bandwidht photonic space switch with traveling wave electrodes in InP, Electroncis Letters, vol. 30, No. 13, pp 1048-1049, 1994.

K. Kawano et al, electrode electroabsorption (TW-EA) modulator with bandwidth over 50 GHz and driving voltage less than than 2V, Electroncis Letters, vol. 33, No. 18, 1997.

O. Kjebon et al, 30 GHz direct modulation bandwidth in detuned loaded InGaAsP DBR lasers at 1.55 um wavelength, Electroncis Letters, vol. 33, No. 6, pp. 488-489, 1997.

S. Kodama et al, 2.3 picoseconds optical gate monolithically integrating photodiode and electroabsorption modulator, Electroncis Letters, vol. 37, No. 19, pp. 1185-1186 2001.

S. Kodama et al, 320 Gbit error-free demultiplexing using ultrafast optical gate monolithically integrating a photodiode and electroabsorption modulator, Electroncis Letter, vol. 39, No. 17, pp. 1269-1270, 2003.

S. Kodama et al, 500 Gbit/s optical gate monolithically integrating photodide and electroabsorption modulator, Electroncis Letters, vol. 40, No. 9, 2004.

Roy Lang et al, Suppresion of the Relaxation Oscillation in the Modulated Output of Semiconductor Lasers, IEEE Journal of Quantum Electronics, vol. QE-12, No. 3, pp. 194-199, 1976.

S. Kodama et al, Ultrafast optical sampling rate monolithically integrating a PD and EAM, Electroncis Letters, vol. 40, No. 11, 2004.

Kam Y. Lau et al, Ultra-High Speed Semiconductor Lasers, IEEE Journal of Quantum Electronics, QE-21, No. 2, pp. 121-138, 1985.

Erwin K. Lau et al, Scaling of resonance frequency for strong injection-locked lasers, Optics Letters, vol. 32, No. 23, pp. 3373-3375, 2007.

Erwin K. Lau et al, Frequency Response Enhancement of Optical Injecition-Locked Lasers, IEEE Journal of Quantum Electonics, vol. 44, No. 1, pp 90-99, 2008.

Erwin K. Lau et al, Strong optical injection-locked semiconductor lasers demonstrating> 100 GHz resonance frequencies and 80-GHz intrinsic bandwidths, Optics Express, vol. 16, No. 9, 2008.

Erwin K. Lau et al, Enhanced Modulation Characteristics of Optical Injection-Locked Lasers: A Tutorial, IEEE Journal of Selected Topics in Quantum Electronics, vol. 15, No. 3., pp. 618-633, 2009.

Mark Lee et al, Broadband Modualtion of Light by Using an Electro-Optic Polymer, Science, vol. 298, pp. 1401-1403, 2002.

Hua Li et al, Injection Locking Dynamics of Vertical Cavity Semiconductor Lasers Under Conventional and Phase Conjugate Injection, IEEE Journal of Quantum Electronics, vol. 32, No. 2, pp. 227-235, 1996.

J.M. Liu et al, Modulation Bandwidth, Nosie, and Stability of a Semiconductor Laser Subject to Strong Injection Locking, IEEE Photonics Technology Letters, vol. 9, No. 10, pp. 1325-1327, 1997.

Dekun Liu et al, Rate Equation Analysis of High Speed Q-Modulated Semiconductor Laser, Journal of Lightwave Technology, vol. 28, No. 21, pp. 3128-3135, 2010.

Jhy-Ming Luo et al, Multimode Small-Signal Analysis of Side-Mode Injection-Locked Semiconductor Lasers, J. Appl. Phys. Letters, vol. 31, pp 685-688, 1992.

J.-M. Luo et al, Stable-Locking Bandwidth in Sidemode Injection Locked-Semiconductor Lasers, Electronics Letters, vol. 27, No. 19, pp. 1737-1739, 1991.

Yasuhiro Matsui et al, 30-GHz Bandwidth 1.55-um Strain-Compensated InGAAlAs-InGaAsP MQW Laser, IEEE Photonics Technology Letters, vol 9, No. 1, pp. 25-27 1997.

Xue-Jun Meng et al, Experimental demonstration of modulation bandwidth enhancement in distributes feedback lasers with external light injection, Electronics Letters, vol. 34, No. 21, pp. 2031-2032, 1998.

Xue-Jun Meng et al, Improved Intrinsic Dynamic Distortions in Directly Modulated Semiconductor Lasers by Optical Injection Locking, IEEE Transactions On Microwave Theory And Techniques, vol. 47, No. 7, pp. 1172-1176, 1999.

Stefan Mohrdiek et al, Chirp Reduction of Directly Modulated Semiconductor Lasers at 10 Gb/s by Strong CW Light Injection, Journal Of Lightwave Technology, vol. 12, No. 3, pp. 418-424, 1994.

Atsushi Murakami et al, Cavity Resonance Shift and Bandwidth Enhancement in Semiconductor Lasers With Strong Light Injection, IEEE Journal Of Quantum Electronics, vol. 39, No. 10, pp. 1196-1204, 2003.

M. Nizette et al, Stabilty and bifurcations of periodically modulated, optically injected laser diodes, Physical Review E, vol. 63, pp. 026212-1-026212-9, 2001.

Michel Nizette et al, Averaged equations for injection locked semiconductor lasers, Physica D, pp. 220-236, 2002.

Kazuto Noguchi et al, Millimeter-wave Ti:LiNb03 Optical Modulators, Journal of Lightwave Technology, vol. 16. No. 4, pp. 615-619, 1998.

Y. Okajima et al, Experimetnal observation of chirp reduction in bandwidth-enhanced semiconductor lasers subject to strong optical injection, Optics Communications, vol. 219, pp. 357-364, 2003.

T.B. Simpson et al, Bandwidth Enhancement and Broadband Noise Reduction in Injection-Locked Semiconductor Lasers, IEE Photonics Technology Letters, vol. 7, No. 7, pp. 709-711, 1995.

T.B. Simpson et al, Small-Signal Analysis of Modulation Characteristics in a Semiconductor Laser Subject to Strong Optical Injection, IEEE Journal Of Quantum Electronics, vol. 32, No. 8, pp. 1456-1324, 1996.

Gennady A. Smolyakov et al, Rate equation analysis of dynamic response in strongly injection-locked semiconductor microring lasers, Proc. Of SPIE, vol. 7933, pp. 79330D-1-79330D-12, 2011.

Gennady A. Smolyakov et al. High-Speed Modulation Analysis of Strongly Injection-Locked Seemiconductor Ring Lasers, IEEE Journal of Quantum Electronics, Vo. 42, No. 11, pp. 1463-1471, 2011.

Gennady A. Smolyakov et al, Rate equation analysis of dynamic response in strongly injection-locked cascaded semiconductor microring lasers, Proc. Of SPIE, vol. 8255, pp. 825508-1 to 825506-11, 2012.

Gennady A. Smolyakov et al, Analysis of High-Frequency Modulation Response of Strongly injectiion-Locked Cascaded Semiconductor Ring Lasers, IEEE Journal of Quantum Electronics, vol. 48, No. 12, pp. 1568-1577, Dec. 2012.

R. Spickerman et al, GaAs/AlGaAs travelling wave electro-optic modulator with an electrical bandwidth > 40 GHz, Electronics Letter, vol. 32, No. 12, pp. 1095-1096, 1996.

H.K. Sung et al, Modulation Bandwidth Enhancement and Nonlinear Distortion Suppression in Directly Modulated Monolithic Injection-Locked DFB Lasers, Interntional Topical Meeting on Microwave Photonics, pp. 27-30, 2003.

(56) References Cited

OTHER PUBLICATIONS

R.G. Walker et al, Low-Voltage, 50η, GaAs/AlGaAs Travelling Wave Modulator With Bandwidth Exceeding 25 Ghz, Electronics Letters, vol. 25, No. 23, pp. 1549-1550, 1989.

X. Wang et al, High-Speed Q-Modulation of Injection-Locked Semiconductor Lasers, IEEE Photonics Journal, vol. 3, No. 5, pp. 936945, 2011.

Sebastian Wieczorek et al, Improved Semiconductor-Laser Dynamics From Induced Population Pulsation, IEEE Journal Of Quantum Electronics, vol. 42, No. 6, pp. 552-562, 2006.

Xiaoxue Zhao et al, Novel modulated-master injection-locke 1.55-um VCSELS, Optics Express, vol. 14, No. 22, pp. 10500-10507.

T. Yoshimatsu et al, 100'Gbit/s error-free retiming operation of monolithic optical gate integrating with photodiode and electroabsorption modulator, Electronics Letters, vol. 40, No. 10, 2004.

Toshihide Yoshimatsu et al, 100-Gb/s Error-free Wavelength Conversion With a Monolithic Optical Gate Integrating a Photodiode and Electroabsorption Modulator, IEEE Photonics Technology Letters, vol. 17, No. 11, pp. 2367-2369, 2005.

X. Zhao et al, 28 GHz optical injection-locked 1.55 um VCSELs, Electroncis Letters, vol. 40, No. 8, 2004.

Xiaoxue Zhao et al, Novel cascaded injection-locked 1.55-um VCSELs with 66 GHz modulation bandwidth, Optics Express, vol. 15, No. 22, pp 14810-14816 2007.

Xiaoxue Zhao et al, Extinction Ratio of Injection-Locked VCSELs, IEEE Photonics Technology Letters, 18, pp. 166-168 2006.

\* cited by examiner

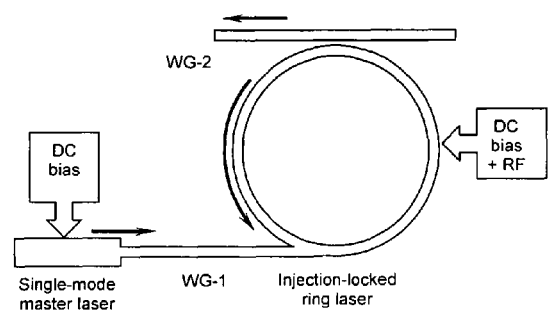
FIG. 1
FIG. 2a
FIG. 2b
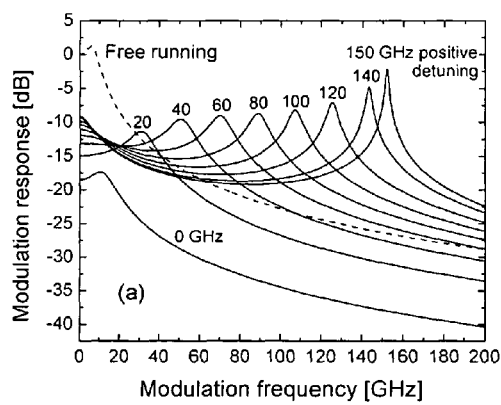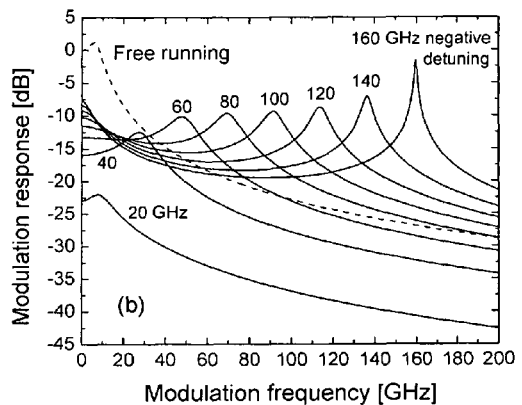

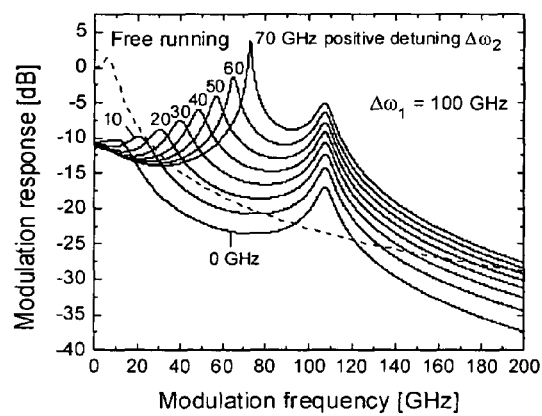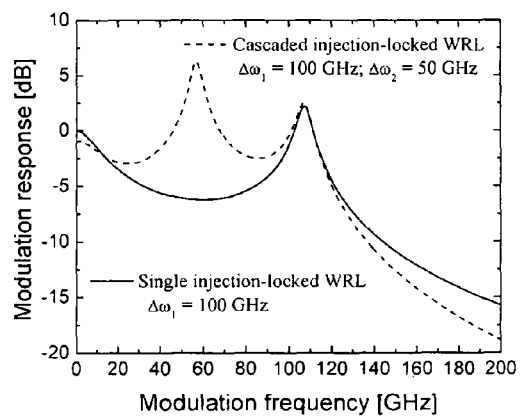
FIG. 4
FIG. 5

LIGHT-EMITTING DEVICE HAVING PHOTON-LIFETIME MODULATION

RELATED APPLICATION

This application claims benefit and priority of U.S. Provisional App. Ser. No. 61/797,476 filed Dec. 7, 2012, the entire disclosure of which is incorporated herein by reference.

FIELD OF THE INVENTION

The present invention relates to a laser system having a master laser monolithically integrated with an injection-locked whistle-geometry ring laser (WRL), the latter having a directly modulated photon lifetime for optical communication beyond 100 GHz.

BACKGROUND OF THE INVENTION

A. Direct Modulation vs. External Modulation of Semiconductor Laser Output

The continuing increase of transmission rates at all levels of telecommunication networks and fiber-based RF photonic systems raises demand for very high-speed, low-cost optical transmitters. Much effort has been put into developing wide-bandwidth lasers and modulators over the past ten years. To date, the largest reported bandwidth of directly modulated free-running semiconductor lasers at 1.55 μm is 30 GHz, as measured in a Fabry-Perot edge-emitting buried-heterostructure multiple-quantum-well (MQW) laser [Matsui 1997 reference] and in a DFB laser [Kjebon 1997 reference]. On the other hand, external modulators operating at speeds of 40 Gb/s are currently available commercially [Covega 2012 reference] and modulators operating at speeds in the 100-GHz range are under development [Chang 2002 reference]. The widest reported 3-dB modulation bandwidth for Ti:LiNbO$_3$ electro-optic (EO) modulators is 70 GHz, with the maximum measured frequency of 110 GHz [Noguchi 1998 reference]. The drawback of the Ti:LiNbO$_3$ modulators, however, is their poor sensitivity, as represented by their unattractively high half-wave voltage $V_\pi$. Very high modulation frequency and broadband performance of the Ti:LiNbO$_3$ modulators come at the expense of too high $V_\pi$ (exceeding 10 V, while the desirable voltage is below 1V), which makes them less attractive for system applications [Cox 2006 reference]. A very impressive 145 GHz modulation bandwidth has been demonstrated for a polymer EO modulator at 1310 nm [Lee 2002 reference]. However, the technology of polymer modulators is still very immature, with most of the development effort being focused on the polymer material itself. In general, polymers with larger EO effect are the least stable against temperature and optical power, which casts doubt on long-term stability of polymer materials [Cox 2006 reference]. In addition, the frequency response of any EO modulator is typically determined by the electrode RF propagation loss and the phase mismatch between the optical beam and modulation microwave [Chung 1991 reference], [Gopalakrishnan 1994], [Chang 2002 reference], which makes overall design and fabrication of these devices complex and costly. Therefore, low-cost small-size directly modulated laser sources with very high modulation bandwidths exceeding 100 GHz are still highly desirable for the rapidly growing applications of RF optical fiber links, and could revolutionize the future of optical telecommunication.

B. Enhancement of Modulation Bandwidth in Injection-Locked Semiconductor Lasers

Since their inception, semiconductor lasers have been key components for many applications in optical fiber communication because of their excellent spectral and beam properties and capability to be directly modulated at very high rates. However, their frequency response has limited the commercial use of directly modulated lasers to digital transmission not exceeding 10 Gb/s. The modulation response of a diode laser is determined by the rate at which the electrons and holes recombine in the active region (spontaneous carrier lifetime $\tau_c$), and the rate at which photons can escape from the laser cavity (photon lifetime $\tau_p$). The modulation bandwidth is limited by the relaxation-oscillation frequency $f_{RO}$ of the laser given by [Lau 1985]

$$2\pi f_{RO} = \sqrt{g_N \gamma_P P_0}, \quad (1)$$

where $g_N$ is the differential optical gain, $P_0$ is the average photon number in the laser cavity, and $\gamma_P$ is the photon decay rate given by the reciprocal of $\tau_p$. Eq. (1) suggests that the relaxation-oscillation frequency can be increased by proper design of laser parameters to get either higher photon density or shorter photon lifetime. Increased injection currents for higher $P_0$ values and shorter laser cavities for smaller $\tau_p$ are ordinarily employed for that purpose in diode lasers. Both approaches, however, involve higher injection current densities, which could result in optical damage to the laser facets and excessive heating. Safe levels of injection current therefore limit the modulation bandwidth in semiconductor lasers.

Optical injection locking has been actively researched for its potential to improve ultrahigh-frequency performance of semiconductor lasers and to reach beyond the record values of modulation bandwidth achieved for free-running devices [Lau 2009 reference]. Injection locking was first demonstrated in 1976 using edge-emitting lasers [Kobayashi 1976 reference], and in 1996 for vertical-cavity surface-emitting lasers (VCSELs) [Li 1996 reference]. The technique uses output of one laser (master) to optically lock another laser (slave), which can still be directly modulated. Significant increase in the resonance frequency and modulation bandwidth, accompanied by reduction in nonlinear distortions [Meng 1999 reference] and frequency chirp [Mohrdiek 1994 reference], has been achieved by injecting external light into diode lasers. So far, improved microwave performance has been observed in edge-emitting lasers with Fabry-Perot cavity; see references [Simpson 1995], [Simpson 1997], [Jin 2006], DFB lasers [Meng 1998], [Hwang 2004], [Sung 2004], [Lau 2008b], and VCSELs [Chrostowski 2002], [Chrostowski 2003], [Okajima 2003], [Chang 2003], [Zhao 2004], [Zhao 2006], [Chrostowski 2006a], [Chrostowski 2006b], [Wong 2006], [Lau 2008b]. The highest experimentally observed 3-dB modulation bandwidth of ~80 GHz, by far exceeding those achieved for free-running devices, has been reported in injection-locked VCSELs and DFB lasers [Lau 2008b].

Many aspects of the injection-locking experimental results have been reproduced in analytical studies; references [Luo 1991], [Simpson 1996], [Nizette 2001, [Nizette 2002], [Lau 2007], [Lau 2008a] and numerical simulations using rate equation models [Luo 1990], [Luo 1992a, [Luo 1992b], [Liu 1997], [Jones 2000], [Chen 2000], [Murakami 2003], [Wieczorek 2006]. Dynamic behavior of diode lasers is described by a system of coupled nonlinear differential equations for the optical field and carrier density in the laser cavity. While for a free-running laser these equations exhibit only damped oscillations with corresponding relaxation-oscillation frequency and damping rate, external optical injection increases the number of degrees of freedom by one, which leads to a much greater variety of dynamic behavior. In particular, perturbation analysis of rate equations, references [Simpson 1996, [Simpson 1997], revealed that the enhanced resonance frequency (the peak frequency in the modulation-frequency response) was identical to the difference between the injected light frequency and a shifted cavity resonance, which agreed well with experimental observations, the physical mechanism of the effect being clarified by references [Murakami 2003], [Wieczorek 2006]. Under strong optical injection, a beating between the injected light frequency and the cavity resonant frequency dominates the dynamic behavior.

C. Limitations of Injection-Locked Edge-Emitting Lasers and VCSELs

Since the detuning between frequencies of the injected light and the cavity mode controls the enhanced resonance frequency in the modulation response of injection-locked semiconductor lasers, obtaining the widest possible stable locking range in terms of the frequency detuning becomes the immediate goal. Strong optical injection is therefore crucial for reaching the ultimate limits of modulation bandwidth enhancement in injection-locked lasers. The coupling rate coefficient $\kappa_c$ for optical injection locking is:

$$\kappa_c = c\sqrt{1-R}/(2n_{eff}L) = \sqrt{1-R}/\tau_{rt}, \qquad (2)$$

where R is the reflectivity of the laser mirror through which the light is injected, L is the cavity length, c is the speed of light, $n_{eff}$ is the effective index, and $\tau_{rt} = 2n_{eff}L/c$ is the cavity roundtrip time.

The smallest possible values for both cavity roundtrip time $\tau_{rt}$ and reflectivity R of the mirror used for injection (maximizing the injection coupling rate coefficient $\kappa_c$) would be ideal for that application. However, as dictated by the requirement to keep threshold current at an acceptable level, the inherent design trade-off between these parameters makes further optimization of both edge-emitting lasers and VCSELs for enhanced high-speed performance very problematic. In edge-emitting lasers, the beneficial effect of rather low mirror reflectivity R on the injection coupling rate coefficient $\kappa_c$ is counteracted by large $\tau_{rt}$ resulting from long laser cavities. Similarly, even though injection-locked VCSELs benefit greatly from very short cavities and, hence, very small $\tau_{rt}$, their high-speed performance, at the same time, is compromised by very high mirror reflectivity of a typical VCSEL, resulting in coupling rate coefficients similar to edge emitters. Further enhancement of resonance frequency in injection-locked edge-emitting lasers and VCSELs is expected to come solely from higher power master lasers used for optical injection. For this reason, more complicated cascaded schemes have been attempted, with demonstrated improvement in modulation bandwidth as compared to solitary injection-locked VCSELs [Zhao 2007 reference]. The cascaded optical injection locking is a very promising technique that has scaling-up potential to eventually reach very wide modulation bandwidth over 100 GHz by cascading more slave lasers in a daisy chain structure, as long as the master laser has enough power to stably lock the slave laser with the largest detuning value [Zhao 2007]. This, however, can hardly be realized with VCSELs, notable for their very high mirror reflectivity. In addition, VCSELs pose a very challenging alignment problem in injection-locking experiments and, at the same time, are not suitable for monolithic integration when injection locking is the requirement. The inventors believe VCSELs are very hard to be optimized for any further improvement in their speed.

D. Strongly Injection-Locked Whistle-Geometry Microring Lasers

To overcome the limitations of injection-locked edge-emitting lasers and VCSELs described above, a novel injection locking scheme (FIG. 1), involving a DBR master laser monolithically integrated with a unidirectional whistle-geometry microring laser (WRL), was developed and is described in U.S. Pat. No. 8,009,712, the teachings of which are incorporated herein by reference. The DBR/WRL geometry allows for strong coupling of the master laser output into the ring slave laser, providing dramatically increased injection coupling rate. By the very nature of WRL, low reflectivity for incident light would not at all compromise the quality of the ring cavity, and would not affect the threshold condition for the wave propagating in the favored direction. This makes WRLs free from the design constraints that edge-emitting lasers and VCSELs suffer from.

The advantage of the novel injection-locking scheme was confirmed in numerical modeling; references [Smolyakov 2011a], [Smolyakov 2011b]. The dynamics of an optically injection-locked WRL monolithically integrated with single-mode master DBR laser was modeled by a system of rate equations written in terms of the photon numbers, phases, and total carrier numbers in the master DBR and microring slave lasers.

The master laser was modeled as a single-mode laser described by the photon number $S_m$ and the optical phase $\theta_m$, related to the master laser field $E_m$ as $E_m = \sqrt{S_m} \exp i\theta_m(t)$:

$$\frac{dS_m}{dt} = \left[G_{0m}(N_m - N_{0m}) - \frac{1}{\tau_p^m}\right]S_m + R_{sp}, \qquad (3)$$

$$\frac{d\theta_m}{dt} = \frac{\alpha}{2}\left[G_{0m}(N_m - N_{0m}) - \frac{1}{\tau_p^m}\right]. \qquad (4)$$

A uniform carrier density was assumed in the laser cavity, with the following rate equation describing time evolution of the total carrier number $N_m$ in the master DBR laser:

$$\frac{dN_m}{dt} = \eta_i \frac{I_m}{q} - \frac{N_m}{\tau_c} - G_{0m}(N_m - N_{0m})S_m. \qquad (5)$$

In Eqs. (3)-(5), $G_{0m}$ is the differential modal gain, given by $$G_{0m} = \frac{\Gamma a v_g}{V_m}, \qquad (6)$$

where $\Gamma$ is the optical confinement factor, $a$ is the differential gain, $v_g$ is the group velocity, and $V_m$ is the master laser active region volume. Other parameters in Eqs. (3)-(5) are the linewidth broadening factor $\alpha$, the transparency carrier number $N_{0m}$, the carrier lifetime $\tau_c$, the photon lifetime $\tau_p^m$, the spontaneous emission rate $R_{sp}$, and the internal quantum efficiency $\eta_i$.

The ring laser was modeled by two counterpropagating modes with photon numbers $S_{cw}$, $S_{ccw}$ and optical phases $\theta_{cw}$, $\theta_{ccw}$ for the clockwise (CW) and counterclockwise (CCW) modes, respectively. The master laser light was assumed to be injected into the CCW mode:

$$\frac{dS_{ccw}}{dt} = \left[G_{ccw} - \frac{1}{\tau_p^{ccw}}\right]S_{ccw} + R_{sp} + 2\kappa_c\sqrt{S_m S_{ccw}}\cos(\theta_{ccw} - \theta_m), \qquad (7)$$

$$\frac{d\theta_{ccw}}{dt} = \frac{\alpha}{2}\left[G_{ccw} - \frac{1}{\tau_p^{ccw}}\right] - (\omega_0 - \omega_{th}) - \kappa_c\sqrt{\frac{S_m}{S_{ccw}}}\sin(\theta_{ccw} - \theta_m), \quad (8)$$

$$\frac{dS_{cw}}{dt} = \left[G_{cw} - \frac{1}{\tau_p^{cw}}\right]S_{cw} + R_{sp}, \quad (9)$$

$$\frac{d\theta_{cw}}{dt} = \frac{\alpha}{2}\left[G_{cw} - \frac{1}{\tau_p^{cw}}\right] - (\omega_0 - \omega_{th}). \quad (10)$$

A uniform carrier density was assumed in the ring laser cavity, with the following rate equation describing time evolution of the carrier number $N_r$ in the ring laser:

$$\frac{dN_r}{dt} = \eta_i \frac{I_r}{q} - \frac{N_r}{\tau_c} - G_{cw}S_{cw} - G_{ccw}S_{ccw}. \quad (11)$$

Eqs. (7)-(10) allow for unequal photon lifetimes $\tau_p^{cw}$ and $\tau_p^{ccw}$ for the CW and CCW modes, respectively. Nonlinear gain saturation effects were taken into account in Eqs. (7)-(11) by coefficients $\epsilon_s$ and $\epsilon_c$ for the self- and cross-gain saturation in the expressions for the modal gain:

$$G_{cw} = \frac{G_{0r}(N_r - N_{0r})}{1 + \epsilon_s S_{cw}/V_r + \epsilon_c S_{ccw}/V_r}; \quad (12)$$

$$G_{ccw} = \frac{G_{0r}(N_r - N_{0r})}{1 + \epsilon_s S_{ccw}/V_r + \epsilon_c S_{cw}/V_r},$$

with $N_{0r}$ standing for the transparency carrier number, and the differential modal gain given by $$G_{0r} = \frac{\Gamma a v_g}{V_r}, \quad (13)$$

where $V_r$ is the ring laser active region volume. Other parameters in Eqs. (7)-(11) are the injection coupling rate $\kappa_c$, the mode frequency of the ring cavity $\omega_0$, and the free-running mode frequency $\omega_{th}$ of the ring cavity at threshold. More details of a 1.55-μm InGaAs/AlGaInAs/InP MQW deeply etched ridge-waveguide laser structure, assumed in the simulation, are given in reference [Smolyakov 2011b].

In calculating the modulation response, a small-signal modulation was applied to the ring laser injection current $I_r$ of Eq. (11) in the form $$I_r = I_{0r}[1 + \delta\sin(2\pi ft)], \quad (14)$$

where $I_{0r}$ is the injection current at a constant ring laser bias, f is the modulation frequency, and δ is the modulation depth. 1% modulation depth (δ=0.01) was assumed throughout the simulations.

Greatly enhanced resonance frequency of up to ~160 GHz was predicted in numerical calculations for the strongly injection-locked ring laser (FIG. 2). Typical of all optical injection-locking schemes, however, the modulation response showed a very significant reduction in the modulation efficiency between low frequencies and the resonance frequency, which limits the usefulness of the novel scheme to narrow-band applications.

E. Strongly Injection-Locked Cascaded Whistle-Geometry Lasers

One possible way to overcome the low-frequency roll-off problem and to attain tailorable and broad modulation bandwidth is to use cascaded injection locking [Zhao 2007 reference]. With the frequency detuning between the injected light and the cavity resonant frequency corresponding to the enhanced resonance frequency in the modulation response of an injection-locked semiconductor laser, adding more slave lasers to the cascaded injection-locking configuration, all injection-locked by the same master laser but with different detunings, results in multiple resonance peaks in the modulation response of the slave laser of the last stage, provided the first slave laser is directly modulated, whereas all the others are modulated indirectly through the modulated optical output of the previous stage.

Using that concept, the injection-locking scheme of FIG. 1 can be modified to a cascaded system with two strongly injection-locked whistle-geometry unidirectional ring lasers (FIG. 3), where the modulated optical output of the first ring laser is used to injection-lock the second ring laser; references [Smolyakov 2012a], [Smolyakov 2012b], as described in the inventors' U.S. Pat. No. 8,009,712, the teachings of which are incorporated herein by reference. FIG. 4 shows modulation-frequency response of the free-running ring laser and that of the second ring laser in the cascaded injection-locking scheme of FIG. 3, calculated for several positive values of frequency detuning $\Delta\omega_2$. For comparison, modulation-frequency response in each case is normalized to the low-frequency response of the free-running laser. One can clearly see further enhancement of the modulation response as the second resonance peak occurring at a lower modulation frequency, corresponding to the frequency detuning $\Delta\omega_2$ between the master and the second ring laser.

In order to illustrate further improvement in the modulation response of the cascaded injection-locking scheme of FIG. 3, as compared to that of the injection-locking scheme of FIG. 1, FIG. 5 shows the modulation response calculated for the two injection-locking schemes under identical bias conditions at frequency detunings $\Delta\omega_1=100$ GHz and $\Delta\omega_2=50$ GHz between the master and the first and the second ring lasers, respectively. The modulation response in both cases is normalized to the low-frequency response of the injection-locking scheme of FIG. 1. Obvious improvement is seen in the modulation response of the cascaded injection-locking scheme, showing a 3-dB modulation bandwidth of ~117 GHz, as compared to that of ~17.3 GHz obtained for the injection locking with a single ring laser.

F. Strongly Injection-Locked Microring Lasers with Modulated Photon Lifetime

As discussed in Section E, the dip in frequency response of a single WRL, shown in FIG. 2, is expected to be moderated by utilizing an injection-locking scheme with multiple cascaded ring lasers (cf. FIGS. 4 and 5 that show the expected improvement with just one additional WRL), which should result in a flat, broadband modulation response. Monolithically integrating multiple cascaded ring lasers on a common substrate would, however, complicate the design of the optoelectronic integrated circuit (OEIC), and a solution that would achieve the same goal with a single ring laser is highly desirable. Pursuant to an embodiment of the invention, the inventors provide novel injection-locked WRLs with directly modulated photon lifetime, rather than modulated injection current, as an elegant solution to the task of flattening the frequency response and achieving a broadband transmitter operating at frequencies beyond 100 GHz.

Photon-lifetime (and therefore cavity-Q) modulation as a means of improving the high-frequency response of semiconductor lasers was independently proposed theoretically in references [Avrutin 1993] and [Dods 1994] for the edge-emitting DBR lasers and VCSELs, respectively. Subsequently, the concept has been extended to bidirectional ring lasers coupled to external EO or electroabsorption (EA) modulators in a compound cavity [Dai 2009 reference]. The photon-lifetime modulation mechanism directly affects the photon density in the laser cavity and is potentially much faster than the conventional injection current modulation that affects the photon density indirectly through relatively slowly varying carrier density. The photon lifetime in a laser above threshold is much shorter than the carrier lifetime. In addition, photon-lifetime modulation offers an advantage of reducing the wavelength chirp, which is quite large in directly modulated diode lasers, while maintaining a stable output wavelength [He 2007], [Dai 2009]. The latter feature requires a careful anti-resonant design of Q-modulator in multi-section DFB lasers; see references [He 2007], [Liu 2010], but is readily achievable in the scheme of this invention by virtue of locking to the stabilized master wavelength.

Employing direct cavity-Q modulation, rather than injection-current modulation, as an effective way to eliminate the low-frequency roll-off in modulation response of injection-locked semiconductor lasers has been investigated theoretically in [Wang 2011 reference] using small-signal and numerical analyses. While the enhanced resonant frequency in Q-modulated injection-locked lasers remained the same as in current-modulated lasers, a significant enhancement in 3-dB bandwidth has been demonstrated in numerical analysis due to elimination of low-frequency roll-off. The modulation response of conventional current-modulated lasers is known to decay as $1/\omega^2$ above the resonance frequency. In contrast, the frequency response in Q-modulated lasers decays as $1/\omega$) at frequencies beyond the resonance frequency, thus allowing a much broader modulation bandwidth, references [Avrutin 1993], [He 2007], [Liu 2010].

Pursuant to an embodiment of the present invention, the inventors have analyzed the potential of cavity-Q-modulation mechanism for the strongly injection-locked WRL of FIG. 1. Modulation was applied to the optical loss term $1/\tau_p^{ccw}$ in Eqs. (7), (8) in the form:

$$1/\tau_p^{ccw} = [1+\delta\sin(2\pi ft)]/(\tau_p^{ccw})_0, \quad (15)$$

where f is the modulation frequency and $\delta$ is the modulation depth. 1% modulation depth for the optical loss ($\delta$=0.01) was assumed in the simulations. In agreement with earlier analyses, much slower decay of the free-running laser modulation response was obtained for the laser modulated through optical loss (FIG. 6). Complete elimination of the low-frequency roll-off and 3-dB modulation bandwidth up to 200 GHz are predicted in the numerical analysis (FIG. 7) for the modulation scheme combining advantages of Q-modulation and strong optical injection locking of WRL.

SUMMARY OF THE INVENTION

The present invention provides a semiconductor light-emitting device comprising a whistle-geometry semiconductor ring laser (WRL) section monolithically integrated on a substrate with a single-frequency distributed-feedback (DFB) master laser section or a distributed-Bragg-reflector (DBR) master laser section such that the ring laser section can be operated in an injection-locking mode while being subjected to direct photon-lifetime (and therefore cavity-Q) modulation, rather than injection-current modulation. The light-emitting device includes a photon-lifetime modulator, to this end operably associated with the WRL. The photon-lifetime modulation for the light circulating in the WRL mode is implemented through an electroabsorption (EA) modulator monolithically integrated on the same semiconductor substrate. The monolithic device may be microchip-size and yields a low-cost ultrafast (over 100 GHz bandwidth) functional optical light transmitter that will be easy to use in practice.

In an illustrative embodiment of the invention, an EA modulator is integrated into a section of the ring laser itself to this end.

In another illustrative embodiment of the invention to this end, a feedback line having the EA modulator is integrated on the chip so as to provide modulated feedback to the ring laser.

Practice of embodiments of the present invention is advantageous to flatten the modulation-frequency response and achieve a broadband transmitter operating at frequencies beyond 100 GHz.

These and other advantages of the present invention will become more readily apparent from the following detailed description taken with the drawings.

BRIEF DESCRIPTION OF THE DRAWINGS

FIG. 1 is a schematic diagram of an optically injection-locked (strong injection) whistle-geometry ring laser monolithically integrated with a single-mode master DBR laser.

FIGS. 2a and 2b show modulation-frequency response of the free-running WRL (dashed curves) and that of the injection-locked WRL calculated for several values of positive frequency detuning (FIG. 2a) and negative frequency detuning (FIG. 2b) between the master DBR laser and the ring laser. Modulation-frequency response is normalized to low-frequency response of the free-running ring laser.

FIG. 4 shows modulation-frequency response of the free-running WRL (dashed curve) and that of the second injection-locked WRL (cascaded scheme of FIG. 3) calculated for several values of positive frequency detuning $\Delta\omega_2$ between the master DBR laser and the second WRL. Modulation signal is applied to the first injection-locked WRL. Modulation-frequency response is normalized to low-frequency response of the free-running ring laser. Frequency detuning between the master DBR laser and the first WRL is $\Delta\omega_1$=100 GHz.

FIG. 5 shows modulation-frequency response of the second injection-locked WRL in the cascaded injection-locking scheme of FIG. 3 (dashed curve) and that of the injection-locked WRL in the injection-locking scheme of FIG. 1 (solid curve) calculated under identical bias conditions. Modulation-frequency response is normalized to low-frequency response of the free-running ring laser in the injection-locking scheme of FIG. 1.

DETAILED DESCRIPTION OF THE INVENTION

Figure 3:
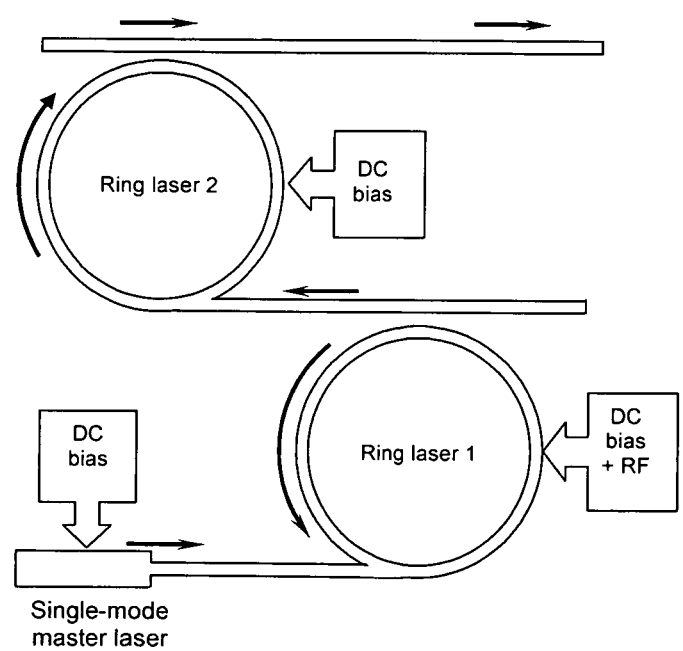
FIG. 3 is a schematic diagram of two cascaded optically injection-locked whistle-geometry ring lasers monolithically integrated with a single-mode master DBR laser.

The following description is offered to further illustrate the invention without limiting it. Optical injection locking has been actively researched for its potential to improve ultra-high-frequency performance of semiconductor lasers for both digital and analog applications as described in U.S. Pat. No. 8,009,712, the disclosure of which is incorporated herein by reference. The highest experimentally observed 3-dB modulation bandwidth of ~80 GHz, by far exceeding those achieved for free-running devices, has been reported in injection-locked vertical-cavity surface-emitting lasers (VCSELs). While laboratory experiments with injection-locked VCSELs demonstrated record-high values for enhanced modulation bandwidth, they require multiple hybrid components that need to be carefully aligned. Their vertical geometry makes VCSELs unsuitable for monolithic integration with the DBR lasers used as masters. Aside from that, typical for all optical-injection-locking schemes, the modulation response shows a very significant reduction in the modulation efficiency between low frequencies and the resonance frequency (low-frequency roll-off), which severely limits the achievable 3-dB modulation bandwidth.

By combining advantages of strong optical injection locking (to dramatically enhance the resonance frequency) and photon-lifetime modulation (to eliminate the low-frequency roll-off in modulation response), the present invention provides a new injection-locking scheme, based on whistle-geometry semiconductor ring lasers (WRLs) monolithically integrated with distributed-Bragg-reflector (DBR) or distributed-feedback (DFB) laser masters, which can result in low-cost ultrafast (over 100 GHz) functional chips that will be easy to use in practice.

Semiconductor ring lasers with modulated photon lifetime have not yet been used for modulation-bandwidth enhancement by injection-locking technique. The present invention provides a novel class of ultra-high-speed integrated light sources based on microring WRLs, with low frequency chirp and wide spur-free dynamic range. The invention has the potential of revolutionizing the field of optical telecommunication, therefore it has all the hallmarks of transformative invention meeting the challenges of $21^{st}$ century.

The use of Q-modulated WRLs holds promise for development of ultra-high-speed chips suitable for use in optical transmission networks. The results may be important for both fundamental and applied physics of semiconductor lasers.

The examples below provide for the first time modulation-bandwidth enhancement in monolithically integrated strongly injection-locked WRLs with modulated photon lifetime that could open up new opportunities for creation of high performance, small size, low cost, ultra-high-speed integrated light sources for all levels of telecommunication networks. Development of inexpensive ultrafast chips operating at speeds exceeding 100 GHz will have a huge societal impact by increasing the transmission capacity of fiber-based networks.

A. Monolithically Integrated Ultrafast Q-Modulated DBR/WRL System

Control of the photon lifetime (or the Q-factor) in semiconductor lasers with Fabry-Perot cavity (edge-emitting lasers and VCSELs) can be achieved by modulating either mirror reflectivity; references [Avrutin 1993], [Dods 1994], [He 2007], [Liu 2010] or distributed optical loss [Dai 2009]. In case of a microring cavity, photon-lifetime modulation can also be achieved by modifying the coupling coefficient between the ring laser and an adjacent waveguide forming a directional coupler [Dai 2009]. The terminology used herein relating to the ring laser (WRL) section 14 in FIGS. 8 and 9 being monolithically integrated with a single-frequency semiconductor distributed-Bragg reflector (DBR) laser section 12 refers to a single or unitary structure formed on a semiconducting substrate S with the structures being formed by various differently doped and undoped layers and regions on the substrate, although the structures may have different functionalities. The device can include an active layer structure which can comprise at least one quantum-well, quantum dashes, quantum dots, or a bulk active layer. Apart from the WRL and DBR laser sections, the light-emitting device also incorporates the EA modulator section 10 in FIG. 8 or 22 in FIG. 9, the passive waveguides WG1 and WG2, directional couplers comprising closely spaced portions of the outcoupling waveguide WG2 and the ring laser cavity 14, and photodetector elements 16 monolithically integrated on the same semiconducting substrate S. All functional elements or sections of the device have single-transverse-mode ridge waveguide structure that may be identical for some or all of them, and share one or more layers of the semiconductor wafer structure spanning the entire length of the chip. A typical layer structure is shown in FIG. 4 of U.S. Pat. No. 8,009,712 incorporated herein by reference. The monolithically integrated unidirectional WRL section and the DBR master laser section have identical or nearly identical single-transverse-mode ridge-waveguide laser structure and share a system of layers comprising the active region of both spanning the entire length of the device as described in U.S. Pat. No. 8,009,712. The layer structure is electrically stimulated to achieve amplification and emission of light within the active region. The injecting waveguide section WG1 is provided between and shared by the master laser section 12 and the ring laser section 10, and used to transmit the output from the master DBR and inject it into the WRL. The identical transverse waveguide structure and system of layers shared by these various sections of the device automatically align the laser sections and ensure common laser polarization in them.

Figure 8:
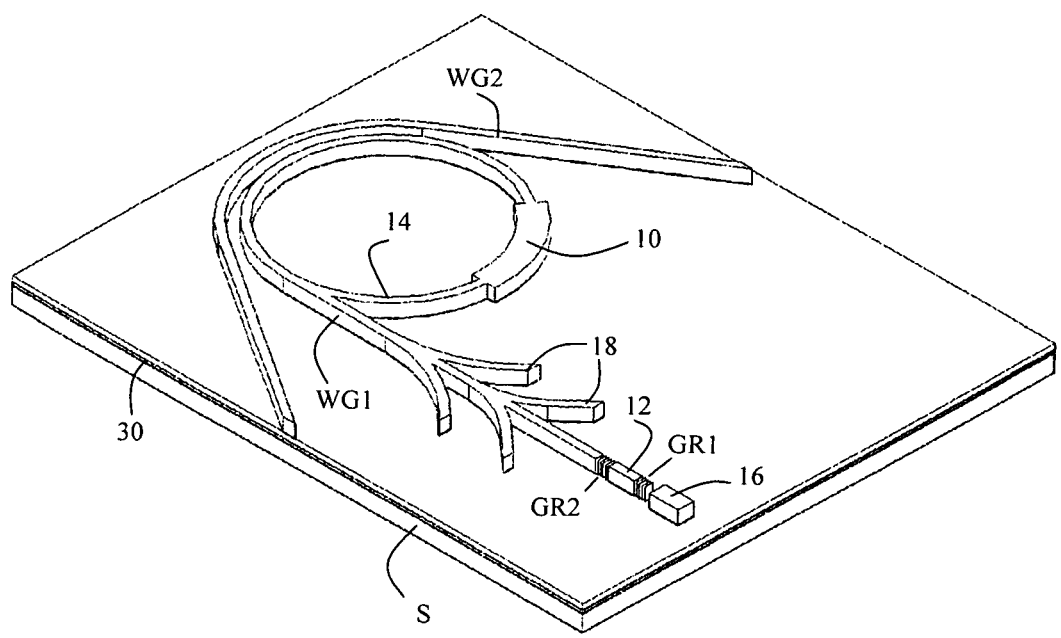
FIG. 8 is a schematic diagram of a DBR laser/WRL OEIC (not to scale), including a DBR laser, a ring laser, passive waveguides WG1 and WG2, an electroabsorption modulator section and an integrated photodetector.
Figure 9:
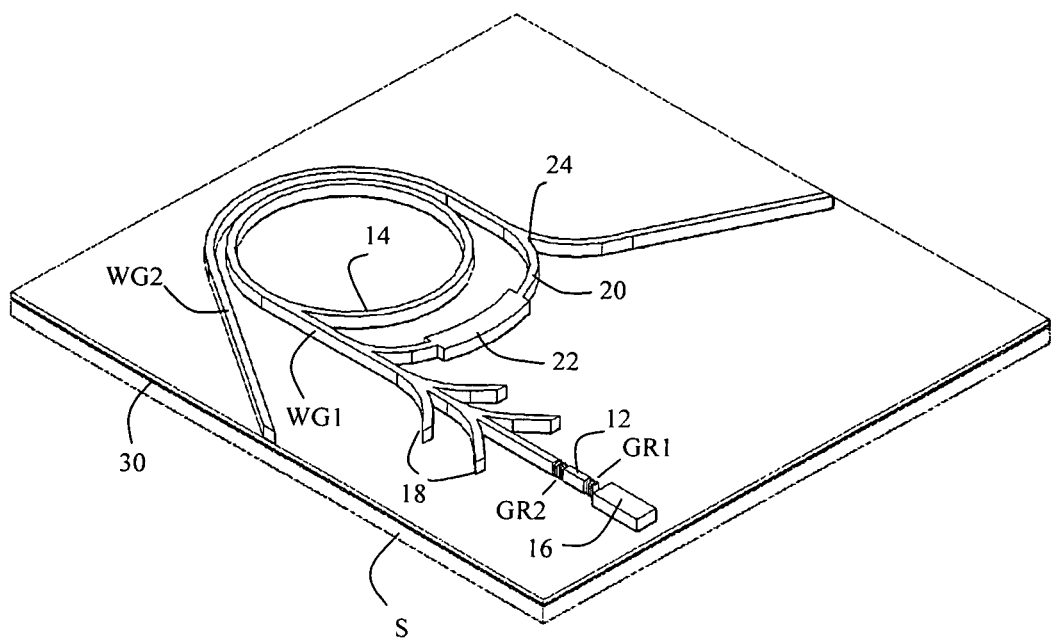
FIG. 9 is a schematic diagram of an alternative OEIC configuration (not to scale) including a Y-splitter and a branched-off EA modulator section.

The present invention envisions various embodiments of a laser device to achieve photon-lifetime modulation. In a first illustrative embodiment (FIG. 8), an EA (electroabsorption) modulator section 10 is inserted inside the microring cavity 14 and isolated electrically from the gain section in the ring cavity. For example, the boundaries between these two sections can be implanted with protons, using proton implantation technique. Proton implantation can also be used to isolate the injecting waveguide WG1, kept at transparency through electrical current injection or rendered transparent through quantum-well intermixing, from the ring 14 and from the master laser 12. For purposes of illustration and not limitation, a single-transverse-mode deep-etched ridge waveguide structure is the basis for both the 1.55-μm InAlAs/AlGaInAs/InP strained MQW DBR and ring lasers, as well as for the waveguides WG1 and WG2. Alternatively, for purposes of further illustration, a single-transverse-mode deep-etched waveguide structure based on InGaAs/AlGaInAs/InP non-strained MQW can be used for both the DBR and ring lasers, as well as for the waveguides WG1 and WG2, although other material combinations can be employed in practice of the invention. The MQW active region is shown in FIGS. 8 and 9 as layer 30, spanning the entire length of the device. The MQW EA modulator section 10 is integrated with the DBR laser 12 and WRL 14 on a common InP substrate S. The MQW EA section 10 is used to implement the photon-lifetime modulation for the light circulating in the WRL mode. The modulator section 10 can be reverse-sbiased and RF modulated (at high frequency) to this end. The reverse-biased monolithically integrated MQW EA modulator section 10 employs the quantum-confined Stark effect (QCSE) to change absorption coefficient of the light passing through it. Alternatively, the modulator can be forward-biased, and the photon-lifetime modulation can be accomplished by changing the absorption/gain values below and/or above transparency levels.

For purposes of illustration and not limitation, the DBR laser comprises deep-etched Bragg reflectors, fabricated using focused-ion-beam etching. To maximize the output directed towards the WRL, the back DBR mirror (represented by grating GR1) can have a much higher reflectivity (e.g. 99%) than that (e.g. 80%) of the front mirror (represented by grating GR2), wherein GR1 and GR2 provide a frequency selective element. It should be emphasized that the whistle geometry of the ring laser makes it unidirectional even without any external light injection. An integrated photodetector 16 located at the backside of the DBR laser 12 is used to monitor the emission from the master laser. Several curved waveguide sections 18 that branch off the "injecting" waveguide WG1 serve to suppress any optical feedback from the WRL to the DBR laser. A waveguide directional coupler (WG2 in FIG. 8) is used to collect the output of the ring laser. The same waveguide is also used to collect the output of the DBR laser when the ring laser is kept at transparency, and to monitor any counterpropagating waves at the opposite end of WG2. In order to minimize optical reflections, both output facets of the waveguide WG2 are at Brewster's angle with respect to the chip edge.

The DBR master laser 12 and the WRL slave laser provide an injection-locking mode of operation of the WRL section (slave laser) 10 by injecting light from the DBR laser section (master laser) through the injecting waveguide WG1, wherein the slave laser section 10 is substantially locked to the same frequency as the master laser section and wherein a significant increase in modulation bandwidth is thereby provided. Direct injection current is applied to the DBR master laser section 12, the ring laser section 10, and optionally to waveguides WG1 and WG2, and a reverse bias voltage is applied to the photodetector 16 using electrodes in a manner described in U.S. Pat. No. 8,009,712 to provide injection locking of the directly modulated ring laser. Conventional laser diode drivers can be used as sources of direct current for the laser sections and optionally for the waveguide sections of the device to this end. Conventional ultra high-frequency signal generator can be used to provide modulation signal for the EA modulator section. A conventional constant voltage source can be used for the photodetector to this end. Optional electrical contacts can be supplied for the passive waveguide sections to reduce optical loss and provide controllable amplification of the circulating optical signal. Alternatively, the waveguides WG1 and WG2 can be rendered transparent using conventional quantum-well intermixing process. One or more additional electrical contacts are deposited on the back side of the semiconducting substrate S below the ridge-waveguide structure of the device. The top and bottom contacts are in electrical communication and used for control of the device during its operation. The operating wavelengths of the laser sections and their output power (as well as the level of optical injection from the master laser section into the WRL) are controlled through the injection currents applied to the corresponding sections. Injection-locking mode of operation of the ring laser section is therefore established by selective tuning of different input currents.

In an alternative embodiment of the invention for use in the event the EA modulator 10 may become saturated by the high photon density circulating inside a strongly injection-locked WRL, the invention provides a device shown schematically in FIG. 9 for photon-lifetime modulation, wherein the laser system again comprises a high-power DBR master laser monolithically integrated with a unidirectional WRL slave on a common substrate, but with an additional feedback line 20 for the WRL slave, which incorporates an EA modulator section 22. A waveguide directional coupler (WG2 in FIG. 9) together with a Y splitter 24 as shown are used to collect the output of the ring laser as well as to implement the feedback line for the WRL. When DC reverse-biased and RF modulated, the MQW EA section 22 will be used for intensity and phase modulation of the light coupled back as feedback into the WRL, thus implementing photon-lifetime modulation for the light circulating in the favored (clockwise in this case) WRL mode. The modulator 22 can also be operated with a positive bias superimposed on high-speed voltage signal, modulating either absorption or gain in the modulator section.

In both embodiments of the invention described above, the MQW EA section 10 or 22 can be realized as a traveling-wave electroabsorption modulator (TW-EAM) with a strained InAlAs/AlGaInAs MQW intrinsic layer (or non-strained InGaAs/AlGaInAs MQW intrinsic layer), consistent with the epitaxial structure of the ring laser WRL, and interactive length appropriate for, or limited by, a particular OIEC design. Traveling-wave modulators do not have lumped-element electrode structures and do not suffer from the RC-constant limitations; see references [Walker 1989], [Kappe 1994], and [Spickermann 1996]. Examples of traveling-wave EA modulators are described in references [Kawano 1997], [Kodama 2001], [Kodama 2003], [Kodama 2004a], [Kodama 2004b], [Yoshimatsu 2004], and [Yoshimatsu 2005], the disclosures of the references of this paragraph and the performance properties of the TW-EAMs described therein being incorporated herein by reference.

Figure 6:
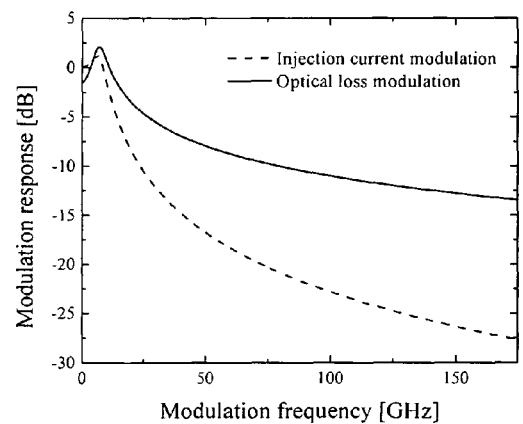
FIG. 6 shows modulation-frequency response of the free-running WRL modulated through injection current (dashed curve) compared to that of the free-running WRL modulated through optical loss (solid curve). Modulation-frequency response is normalized to low-frequency response of the free-running ring laser modulated through injection current.
Figure 7A:
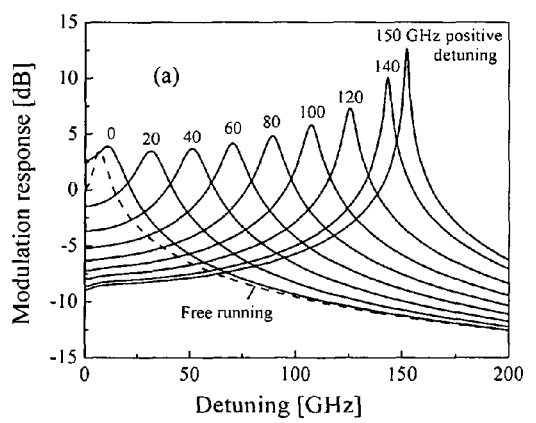
FIGS. 7a and 7b show Q-modulation-frequency response of the free-running WRL (dashed curve) and that of the injection-locked WRL calculated for several values of positive frequency detuning (FIG. 7a) and negative frequency detuning (FIG. 7b) between the master DBR laser and the ring laser. Modulation signal is applied to the first injection-locked WRL. Modulation-frequency response is normalized to low-frequency response of the free-running ring laser.
Figure 7B:
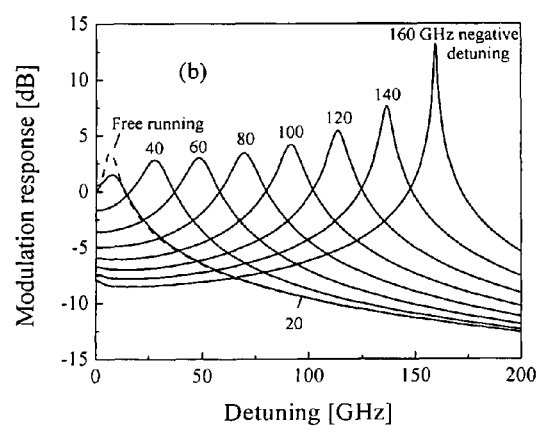

Preliminary analysis (see FIGS. 6 and 7) shows that monolithically integrated Q-modulated injection-locked WRLs are extremely attractive for achieving record-high modulation bandwidths. They are expected to surpass the injection-locked VCSELs and edge-emitting Fabry-Perot lasers in their high-speed performance and to be comparable to the record-holding external EO modulators. The monolithic integration approach will make them much more practical, by eliminating the need for alignment, and will ultimately greatly reduce the cost of the system. Q-modulated injection-locked WRLs could be as important new technology for ultrafast low-cost optical transmitters as VCSELs were at the time of their inception. WRLs may likely become a new disruptive technology, replacing the existing technologies based on VCSELs or external EO modulators.

Fabrication of the semiconductor laser devices pursuant to the invention can be conducted using conventional semiconductor laser production operations, wherein multiple semiconductor lasers pursuant to the invention are fabricated on a larger semiconductor wafer, which is then separated into a plurality of semiconductor laser devices. A preferred method for growing the epitaxial semiconductor wafer for fabrication of the device in the present invention is metal-organic chemical vapor deposition (MOCVD). Other epitaxial growth techniques, including metal-organic vapor-phase epitaxy (MOVPE) and molecular beam epitaxy (MBE), as well as other semiconductor material systems and other epitaxial layer structures are applicable to the present invention. After the growth of the epitaxial semiconductor wafer, the portions of the wafer undergo further processing that results in creation of the ridge waveguide structures forming all the functional sections of the device. An exemplary process using electron beam lithography and liftoff is described in U.S. Pat. No. 8,009,712 incorporated herein by reference, although other fabrication processes, such as focused ion beam etching, can be employed.

Although certain embodiments of the invention have been described in detail herein, those skilled in the art will appreciate that modifications and changes can be made therein with the scope of the invention as set forth in the appended claims.

REFERENCES CITED AND INCORPORATED HEREIN BY REFERENCE

[Avrutin 1993] E. A. Avrutin, V. B. Gorfinkel, S. Luryi, and K. A. Shore, "Control of surface-emitting laser diodes by modulating the distributed Bragg mirror reflectivity: Small-signal analysis", *Appl. Phys. Lett.* 63 (#18), pp. 2460-2462, 1 Nov. 1993.

[Chang 2002] W. S. C. Chang, Ed., *RF Photonic Technology in Optical Fiber Links*, Cambridge Univ. Press, Cambridge, UK 2002, Chs. 4-7.

[Chang 2003] C. H. Chang, L. Chrostowski, and C. J. Chang-Hasnain, "Injection locking of VCSELs", *IEEE J. Sel. Top. Quantum Electron.* 9 (#5), pp. 1386-1393, September-October 2003.

[Chen 2000] H. F. Chen, J. M. Liu, and T. B. Simpson, "Response characteristics of direct current modulation on a bandwidth-enhanced semiconductor laser under strong injection locking", *Opt. Commun.* 173 (#1-6), pp. 349-355, 1 Jan. 2000.

[Chrostowski 2002] L. Chrostowski, C. H. Chang, and C. J. Chang-Hasnain, "Injection-locked 1.55 µm VCSELs with enhanced spur-free dynamic range", *Electron. Lett.* 38 (#17), pp. 965-967, 15 Aug. 2002.

[Chrostowski 2003] L. Chrostowski, C. H. Chang, and C. J. Chang-Hasnain, "Enhancement of dynamic range in 1.55-µm VCSELs using injection locking", *IEEE Photon. Technol. Lett.* 15 (#4), pp. 498-500, April 2003.

[Chrostowski 2006a] L. Chrostowski, X. Zhao, C. J. Chang-Hasnain, R. Shau, A. Ortsiefer, and M. C. Amann, "50-GHz optically injection-locked 1.55-µm VCSELs", *IEEE Photon. Technol. Lett.* 18 (#1-4), pp. 367-369, January-February 2006.

[Chrostowski 2006b] L. Chrostowski, X. X. Zhao, and C. J. Chang-Hasnain, "Microwave performance of optically injection-locked VCSELs", *IEEE Trans. Microw. Theory Tech.* 54 (#2, Pt. 2), pp. 788-796, February 2006.

[Chung 1991] H. Y. Chung, W. S. C. Chang, and E. L. Adler, "Modeling and optimization of traveling-wave LiNbO₃ interferometric modulators", *IEEE J. Quantum Electron.* 27 (#3), pp. 608-617, March 1991.

[Covega 2012] Covega Corporation, Jessup, Md.: http://www.covega.com/Products/?catID=7

[Cox 2006] C. H. Cox III, E. I. Ackerman, G. E. Betts, and J. L. Prince, "Limits on the performance of RF-over-fiber links and their impact on device design", *IEEE Trans. Microw. Theory Tech.* 54 (#2, Pt. 2), pp. 906-920, February 2006.

[Dai 2009] D. X. Dai, A. Fang, and J. E. Bowers, "Hybrid silicon lasers for optical interconnects", *New J. Phys.* 11, Art. 125016 (17 pp.), 17 Dec. 2009.

[Dods 1994] S. R. A. Dods and M. Ogura, "Q-modulation of a surface-emitting laser and an integrated detuned cavity", *IEEE J. Quantum Eelectron.* 30 (#5), pp. 1204-1211, May 1994.

[Gopalakrishan 1994] G. K. Gopalakrishnan and W. K. Burns, "Performance and modeling of resonantly enhanced LiNbO₃ modulators for low-lo s analog fiberoptic links", *IEEE Trans. Microw. Theory Tech.* 42 (#12, Pt. 2), pp. 2650-2656, December 1994.

[He 2007] J.-J. He, "Proposal for Q-modulated semiconductor laser", *IEEE Photon. Technol. Lett.* 19 (#5), pp. 285-287, 1 Mar. 2007.

[Hwang 2004] S. K. Hwang, J. M. Liu, and J. K. White, "35-GHz intrinsic bandwidth for direct modulation in 1.3-µm semiconductor lasers subject to strong injection locking", *IEEE Photon. Technol. Lett.* 16 (#4), pp. 972-974, April 2004.

[Jin 2006] X. M. Jin and S. L. Chuang, "Bandwidth enhancement of Fabry-Perot quantum-well lasers by injection-locking", *Solid-State Electron.* 50 (#6), pp. 1141-1149, June 2006.

[Jones 2000] R. J. Jones, P. S. Spencer, and K. A. Shore, "Influence of detuned injection locking on the relaxation oscillation frequency of a multimode semiconductor laser", *J. Mod. Opt.* 47 (#11), pp. 1977-1986, September 2000.

[Kappe 1994] F. Kappe, G. G. Mekonnen, C. Bornholdt, F. W. Reier, and D. Hoffman, "35 GHz bandwidth photonic space switch with traveling-wave electrodes on InP", *Electron. Lett.* 30 (#13), pp. 1048-1049, June 1994.

[Kawano 1997] K. Kawano, M. Kohtoku, M. Ueki, T. Ito, S. Kondoh, Y. Noguchi, and Y. Hasumi, "Polarisation-insensitive travelling-wave electrode electroabsorption (TW-EA) modulator with bandwidth over 50 GHz and driving voltage less than 2V", *Electron. Lett.* 33 (#18), pp. 1580-1581, August 1997.

[Kjebon 1997] O. Kjebon, R. Schatz, S. Lourdudoss, S. Nilsson, B. Stalnacke, and L. Backbom, "30 GHz direct modulation bandwidth in detuned loaded InGaAsP DBR lasers at 1.55 µm wavelength", *Electron. Lett.* 33 (#6), pp. 488-489, March 1997.

[Kobayashi 1976] K. Kobayashi and R. Lang, "Suppression of the relaxation oscillation in the modulated output of semiconductor lasers", *IEEE J. Quantum Electron.* 12 (#3), pp. 194-199, March 1976.

[Kodama 2001] S. Kodama, T. Ito, N. Watanabe, S. Kondo, H. Takeuchi, H. Ito, and T. Ishibashi, "2.3 picoseconds optical gate monolithically integrating photodiode and electroabsorption modulator", *Electron. Lett.* 37 (#19), pp. 1185-1186, September 2001.

[Kodama 2003] S. Kodama, T. Yoshimatsu, and H. Ito, "320 Gbit/s error-free demultiplexing using ultrafast optical gate monolithically integrating a photodiode and electroabsorption modulator", *Electron. Lett.* 39 (#17), pp. 1269-1270, August 2003.

[Kodama 2004a] S. Kodama, T. Yoshimatsu, and H. Ito, "500 Gbit/s optical gate monolithically integrating photodiode and electroabsorption modulator", *Electron. Lett.* 40 (#9), pp. 555-557, April 2004.

[Kodama 2004b] S. Kodama, T. Shimizu, T. Yoshimatsu, K. Yoshino, T. Furuta, and H. Ito, "Ultrafast optical sampling gate monolithically integrating a PD and EAM", *Electron. Lett.* 40 (#11), pp. 696-697, May 2004.

[Lau 1985] K. Y. Lau and A. Yariv, "Ultra-high speed semiconductor lasers", IEEE J. Quantum Electron. 21 (#2), pp. 121-138, 1985.

[Lau 2007] E. K. Lau, H.-K. Sung, and M. C. Wu, "Scaling of resonance frequency for strong injection-locked lasers", Optics Lett. 32 (#23), pp. 3373-3375, December 2007.

[Lau 2008a] E. K. Lau, H.-K. Sung, and M. C. Wu, "Frequency response enhancement of optical injection-locked lasers", IEEE J. Quantum Electron. 44 (#1), pp. 90-99, January 2008.

[Lau 2008b] E. K. Lau, X. X. Zhao, H.-K. Sung, D. Parekh, C. Chang-Hasnain, and M. C. Wu, "Strong optical injection-locked semiconductor lasers demonstrating >100-GHz resonance frequencies and 80-GHz intrinsic bandwidths", Opt. Express 16 (#9), pp. 6609-6618, April 2008.

[Lau 2009] E. K. Lau, L. J. Wong, and M. C. Wu, "Enhanced modulation characteristics of optical injection-locked lasers: A tutorial", IEEE J. Sel. Topics Quantum Electron. 15 (#3), pp. 618-633, May-June 2009.

[Lee 2002] M. Lee, H. E. Katz, C. Erben, D. M. Gill, P. Gopalan, J. D. Heber, and D. J. McGee, "Broadband modulation of light by using an electro-optic polymer", Science 298 (#5597), pp. 1401-1403, 15 Nov. 2002.

[Li 1996] H. Li, T. L. Lucas, J. G. McInerney, M. W. Wright, and R. A. Morgan, "Injection locking dynamics of vertical cavity semiconductor lasers under conventional and phase conjugate injection", IEEE J. Quantum Electron. 32 (#2), pp. 227-235, February 1996.

[Liu 1997] J. M. Liu, H. F. Chen, X. J. Meng, and T. B. Simpson, "Modulation bandwidth, noise, and stability of a semiconductor laser subject to strong injection locking", IEEE Photon. Technol. Lett. 9 (#10), pp. 1325-1327, October 1997.

[Liu 2010] D. K. Liu, L. Wang, and J.-J. He, "Rate equation analysis of high speed Q-modulated semiconductor laser", J. Lightwave Technol. 28 (#21), pp. 3128-3135, 1 Nov. 2010.

[Luo 1990] J.-M. Luo and M. Osiński, "Side-mode injection locking characteristics of semiconductor lasers: Multimode analysis", Proc. 1$^{st}$ International Workshop on Photonic Networks, Components and Applications (J. Chrostowski and J. Terry, Eds.), Montebello, Quebec, Canada, 11-13 October, 1990, Series in Optics and Photonics Vol. 2, World Scientific, Singapore 1991, pp. 195-199.

[Luo 1991] J.-M. Luo and M. Osiński, "Stable-locking bandwidth in sidemode injection locked semiconductor lasers", Electron. Lett. 27 (#19), pp. 1737-1739, 12 Sep. 1991.

[Luo 1992a] J.-M. Luo and M. Osiński, "Side-mode injection locking characteristics of semiconductor lasers: Frequency and field noise spectra", Proc. 2$^{nd}$ IEEE International Workshop on Photonic Networks, Components and Applications (J. Chrostowski and J. Terry, Eds.), Montebello, Quebec, Canada, 9-11 March, 1992, OCRI Publications, pp. 3.1.1-3.1.6.

[Luo 1992b] J.-M. Luo and M. Osiński, "Multimode small-signal analysis of side-mode injection-locked semiconductor lasers", Jpn. J. Appl. Phys. Pt. 2 (Lett.) 31, pp. L685-L688, June 1992.

[Matsui 1997] Y. Matsui, H. Murai, S. Arahira, S. Kutsuzawa, and Y. Ogawa, "30-GHz bandwidth 1.55-µm strain-compensated InGaAlAs—InGaAsP MQW laser", IEEE Photon. Technol. Lett. 9 (#1), pp. 25-27, January 1997.

[Meng 1998] X. J. Meng, T. Chau, and M. C. Wu, "Experimental demonstration of modulation bandwidth enhancement in distributed feedback lasers with external light injection", Electron. Lett. 34 (#21), pp. 2031-2032, 15 Oct. 1998.

[Meng 1999] X. J. Meng, T. Chau, and M. C. Wu, "Improved intrinsic dynamic distortions in directly modulated semiconductor lasers by optical injection locking", IEEE Trans. Microw. Theory Tech. 47 (#7, Pt. 2), pp. 1172-1176, July 1999.

[Mohrdiek 1994] S. Mohrdiek, H. Burkhard, and H. Walter, "Chirp reduction of directly modulated semiconductor lasers at 10 Gb/s by strong CW light injection", J. Lightwave Technol. 12 (#3), pp. 418-424, March 1994.

[Murakami 2003] A. Murakami, K. Kawashima, and K. Atsuki, "Cavity resonance shift and bandwidth enhancement in semiconductor lasers with strong light injection", IEEE J. Quantum Electron. 39 (#10), pp. 1196-1204, October 2003.

[Nizette 2001] M. Nizette, T. Erneux, A. Gavrielides, and V. Kovanis, "Stability and bifurcations of periodically modulated, optically injected laser diodes", Phys. Rev. E 63 (#2, Pt. 2), Art. 026212, February 2001.

[Nizette 2002] M. Nizette, T. Erneux, A. Gavrielides, and V. Kovanis, "Averaged equations for injection locked semiconductor lasers", Physica D 161 (#3-4), pp. 220-236, January 2002.

[Noguchi 1998] K. Noguchi, O. Mitomi, and H. Miyazawa, "Millimeter-wave Ti:LiNbO$_3$ optical modulators", J. Lightwave Technol. 16 (#4), pp. 615-619, April 1998.

[Okajima 2003] Y. Okajima, S. K. Hwang, and J. M. Liu, "Experimental observation of chirp reduction in bandwidth-enhanced semiconductor lasers subject to strong optical injection", Opt. Commun. 219 (#1-6), pp. 357-364, 15 Apr. 2003.

[Simpson 1995] T. B. Simpson and J. M. Liu, "Bandwidth enhancement and broad-band noise-reduction in injection-locked semiconductor lasers", IEEE Photon. Technol. Lett. 7 (#7), pp. 709-711, July 1995.

[Simpson 1996] T. B. Simpson, J. M. Liu, and A. Gavrielides, "Small-signal analysis of modulation characteristics in a semiconductor laser subject to strong optical injection", IEEE J. Quantum Electron. 32 (#8), pp. 1456-1468, August 1996.

[Simpson 1997] T. B. Simpson and J. M. Liu, "Enhanced modulation bandwidth in injection-locked semiconductor lasers", IEEE Photonics Technol. Lett. 9 (#10), pp. 1322-1324, October 1997.

[Smolyakov 2011a] G. A. Smolyakov and M. Osiński, "Rate equation analysis of dynamic response in strongly injection-locked semiconductor microring lasers", in Physics and Simulation of Optoelectronic Devices XIX (B. Witzigmann, F. Henneberger, Y. Arakawa, and A. Freundlich, Eds.), SPIE International Symp. on Integrated Optoelectronic Devices OPTO 2011, San Francisco, Calif., 24-27 January 2011, Proc. SPIE 7933, Art. 79330D (12 pp.).

[Smolyakov 2011b] G. A. Smolyakov and M. Osiński, "High-speed modulation analysis of strongly injection-locked semiconductor ring lasers", J. Quantum Electron. 47 (#11), pp. 1463-1471, November 2011.

[Smolyakov 2012a] G. A. Smolyakov, Y. Fichou, and M. Osiński, "Rate equation analysis of dynamic response in strongly injection-locked cascaded semiconductor microring lasers", in Physics and Simulation of Optoelectronic Devices XX (B. Witzigmann, M. Osiński, F. Henneberger, and Y. Arakawa, Eds.), SPIE International Symp. on Integrated Optoelectronic Devices OPTO 2012, San Francisco, Calif., 23-26 Jan. 2012, Proc. SPIE 8255, Art. 825508 (11 pp.).

[Smolyakov 2012b] G. A. Smolyakov, Y. Fichou, and M. Osiński, "Analysis of high-frequency modulation response of strongly injection-locked cascaded semiconductor ring lasers", *IEEE J. Quantum Electron.* 48 (#12), pp. 1568-1577, December 2012.

[Spickermann 1996] R. Spickermann, S. R. Sakamoto, M. G. Peters, and N. Dagli, "GaAs/AlGaAs travelling wave electro-optic modulator with an electrical bandwidth >40 GHz", *Electron. Lett.* 32 (#12), pp. 1095-1096, June 1996.

[Sung 2004] H.-K. Sung, T. Jung, M. C. Wu, D. Tishinin, T. Tanbun-Ek, K. Y. Liou, and W. T. Tsang, "Modulation bandwidth enhancement and nonlinear distortion suppression in directly modulated monolithic injection-locked DFB lasers", in *Proc. International Topical Meeting on Microwave Photonics MWP* 2003, pp. 27-30, 2004.

[Walker 1989] R. G. Walker, I. Bennion, and A. C. Carter, "Low-voltage, 50-□, GaAs/AlGaAs traveling-wave modulator with bandwidth exceeding 25 GHz", *Electron. Lett.* 25 (#23), pp. 1549-1550, November 1989.

[Wang 2011] X. Wang and L. Chrostowski, "High-speed Q-modulation of injection-locked semiconductor lasers", *IEEE Photon. J* 3 (#5), pp. 936-945, October 2011.

[Wieczorek 2006] S. Wieczorek, W. W. Chow, L. Chrostowski, and C. J. Chang-Hasnain, "Improved semiconductor-laser dynamics from induced population pulsation", *IEEE J. Quantum Electron.* 42 (#5-6), pp. 552-562, May-June 2006.

[Wong 2006] E. Wong, X. X. Zhao, C. J. Chang-Hasnain, W. Hofmann, and M. C. Amann, "Optically injection-locked 1.55-μm VCSELs as upstream transmitters in WDM-PONs", *IEEE Photon. Technol. Lett.* 18 (#21-24), pp. 2371-2373, November-December 2006.

[Yoshimatsu 2004] T. Yoshimatsu, S. Kodama, K. Yoshino, H. Ito, "100 Gbit/s error-free retiming operation of monolithic optical gate integrating with photodiode and electroabsorption modulator", *Electron. Lett.* 40 (#10), pp. 626-628, May 2004.

[Yoshimatsu 2005] T. Yoshimatsu, S. Kodama, K. Yoshino, H. Ito, "100-Gb/s error-free wavelength conversion with a monolithic optical gate integrating a photodiode and electroabsorption modulator", *IEEE Photon. Technol. Lett.* 17 (#11), pp. 2367-2369, November 2005.

[Zhao 2004] X. Zhao, M. Moewe, L. Chrostowski, C. H. Chang, R. Shau, M. Ortsiefer, M. C. Amann, and C. Chang-Hasnain, "28 GHz optical injection-locked 1.55 μm VCSELs", *Electron. Lett.* 40 (#8), pp. 476-478, 15 Apr. 2004.

[Zhao 2006] X. X. Zhao, D. Parekh, E. K. Lau, H.-K. Sung, M. C. Wu, and C. J. Chang-Hasnain, "High extinction ratio of injection-locked 1.55-μm VCSELs", *IEEE Photon. Technol. Lett.* 18 (#1-4), pp. 166-168, January-February 2006.

[Zhao 2007] X. X. Zhao, D. Parekh, E. K. Lau, H.-K. Sung, M. C. Wu, W. Hofmann, M. C. Amann, and C. J. Chang-Hasnain, "Novel cascaded injection-locked 1.55-μm VCSELs with 66 GHz modulation bandwidth", *Opt. Express* 15 (#22), pp. 14810-14816, 29 Oct. 2007.

What is claimed is:

1. A semiconductor light-emitting device comprising a single-frequency master laser and an injection-lockable slave ring laser monolithically integrated on a substrate, wherein the ring laser is operably associated with a monolithically integrated modulator that modulates photon lifetime of the ring laser.

2. The device of claim 1, wherein the master laser comprises a distributed-feedback laser or a distributed Bragg-reflector laser.

3. The device of claim 1, wherein the ring laser is a whistle-geometry ring laser.

4. The device of claim 1, wherein the ring laser has a diameter less than 100 microns.

5. The device of claim 1, having a ridge waveguide structure.

6. The device of claim 1, including an active layer structure comprising at least one quantum-well, quantum dashes, quantum dots, or a bulk active layer.

7. The device of claim 1, wherein a monolithically integrated injecting waveguide is used to collect light from the master laser and deliver it to the slave ring laser.

8. The device of claim 7, wherein the monolithically integrated injecting waveguide is used to transfer light from the master laser into the ring laser by directly connecting to the ring laser in whistle geometry.

9. The device of claim 7, wherein the monolithically integrated injecting waveguide is used to transfer light from the master laser into the ring laser by means of directional waveguide coupling.

10. The device of claim 7, wherein the monolithically integrated injecting waveguide is rendered transparent to the light emitted by the master laser by means of quantum-well, quantum-dash, or quantum-dot intermixing.

11. The device of claim 1, further including multiple non-reciprocating curved waveguides branching off from the injecting waveguide between the master laser and the ring laser section and used to suppress any optical feedback from the ring laser to the master laser.

12. The device of claim 1, further including a monolithically integrated directional waveguide coupler proximate to the ring laser to collect its output.

13. The device of claim 12, wherein the monolithically integrated outcoupling waveguide is rendered transparent to the light emitted by the ring laser by means of quantum-well, quantum-dash, or quantum-dot intermixing.

14. The device of claim 1, wherein a direct injection current is applied to the master laser and to the ring laser, and wherein high-speed voltage modulation is applied to the modulator under reverse bias conditions.

15. The device of claim 1, further including a monolithically integrated photodetector located at the backside of the master laser to monitor the emission from the master laser.

16. The device of claim 15, wherein a reverse bias voltage is independently applied to the monitoring photodetector.

17. The device of claim 16, wherein the reverse bias voltage for the monitoring photodetector is electrically isolated from other elements of the device by means of proton implantation.

18. The device of claim 1, wherein the modulator comprises an electroabsorption modulator.

19. The device of claim 18, wherein the electroabsorption modulator is integrated into a section of the ring laser cavity.

20. The device of claim 18, including the electroabsorption modulator in a feedback branch or line so integrated on the substrate as to communicate to the ring laser to collect part of its output and provide modulated feedback to the ring laser.

21. The device of claim 18, wherein the electroabsorption modulator comprises a traveling-wave electroabsorption modulator.

22. The device of claim 1, based on InAlAs/AlGaInAs/InP or InGaAs/AlGaInAs/InP materials.

23. A method of injection locking a semiconductor ring laser modulated through photon lifetime, the method comprising:
providing a semiconductor light-emitting device comprising a semiconductor ring laser monolithically integrated on a common substrate with a semiconductor master laser having a frequency selective element, wherein the light output from the semiconductor master laser is used to injection-lock the semiconductor ring laser to the same frequency by delivering light through a monolithically integrated waveguide carrying light from the master laser to the ring laser;

supplying a direct current bias to the master laser such that the master laser output has a power level sufficient to increase the density of photons inside the semiconductor ring laser;

supplying a direct current bias to the semiconductor ring laser and a modulated voltage input signal to a photon-lifetime modulator operably associated with the semiconductor ring laser for emission of light modulated in response to the input signal;

selectively tuning the direct bias currents to the master laser and ring laser in order to establish an injection locking mode of operation of the ring laser; and adjusting the resonant frequency offset between the master laser and the semiconductor ring laser such as to increase the modulation bandwidth of the ring laser.

\* \* \* \* \*